(12) United States Patent
Block et al.

(10) Patent No.: US 7,650,548 B2
(45) Date of Patent: Jan. 19, 2010

(54) POWER SAVING FLIP-FLOP

(75) Inventors: Stefan G. Block, Munich (DE); Stephan Habel, Berg (DE)

(73) Assignee: LSI Corporation, Milpitas, CA (US)

( * ) Notice: Subject to any disclaimer, the term of this patent is extended or adjusted under 35 U.S.C. 154(b) by 321 days.

(21) Appl. No.: 11/696,420

(22) Filed: Apr. 4, 2007

(65) Prior Publication Data

US 2008/0250283 A1 Oct. 9, 2008

(51) Int. Cl.
*G01R 31/28* (2006.01)
(52) U.S. Cl. .................. 714/726; 714/30; 714/727; 714/729
(58) Field of Classification Search ............. None
See application file for complete search history.

(56) References Cited

U.S. PATENT DOCUMENTS 5,838,693 A * 11/1998 Morley .................. 714/726
2002/0162065 A1 * 10/2002 Kashiwagi ............... 714/726
2004/0075479 A1 * 4/2004 Gupta .................. 327/202
2004/0117705 A1 * 6/2004 Zounes .................. 714/726
2005/0283691 A1 * 12/2005 Chae .................... 714/726
2007/0061647 A1 * 3/2007 Dhong et al. ............ 714/726
2007/0300108 A1 * 12/2007 Saint-Laurent et al. ..... 714/726

* cited by examiner

*Primary Examiner*—John P Trimmings
(74) *Attorney, Agent, or Firm*—William W. Cochran; Cochran Freund & Young LLC

(57) ABSTRACT

A scannable flip-flop and method are provided. The flip-flop includes a clock input, a normal data input, a test data input, a normal data output and a scan data output. The flip-flop has a normal operating mode during which the normal data output is enabled and the scan data output disabled and has a scan-shift mode during which the normal data output is disabled and the scan data output is enabled.

19 Claims, 5 Drawing Sheets

US 7,650,548 B2

POWER SAVING FLIP-FLOP

FIELD OF THE DISCLOSURE

The present disclosure relates to electrical circuit devices, such as those used in semiconductor integrated circuits. More particularly, the present disclosure relates to scannable flip-flops and other synchronous elements.

BACKGROUND OF THE DISCLOSURE

Semiconductor integrated circuits often incorporate hundreds of thousands of semiconductor elements on a single chip. Logical functions are typically separated by sequential elements, such as flip-flops, which define clock boundaries within individual signal paths.

It is common to convert at least some of the sequential elements with "scannable" elements that assist in testing the integrated circuit after fabrication. One common testing methodology is referred to as "scan testing". Scan testing can be implemented, for example, by converting selected sequential elements into scannable elements by adding extra logic and a multiplexer. Each scannable element selects data from a normal data input or a test data input based on a test enable signal. The scannable elements are connected together by forming a scan chain, wherein the output of each scannable element is connected to the test data input of the next, subsequent scannable element in the chain.

With integrated circuit designs becoming larger and larger, power consumption within a particular design becomes more and more important. With current scannable elements, the logic that is added along the scan path to implement scan testing includes logic that toggles during the normal, functional data flow mode. As a result, the test logic that continues to switch and consume power although the logic is not functionally used during normal operation.

Similarly, during scan-shift when vector are being scanned through the scan chain, functional gates that are not used during scan-shift continue to toggle and consume power. This extra power consumption can become high, especially since the scan-shift frequency is typically set as high as possible to reduce the test time. As a result, the maximum power-consumption of a device can occur during scan-shift.

Improved sequential devices are therefore desired that are capable of consuming less power.

SUMMARY

An aspect of the disclosure relates to a scannable flip-flop, which includes a clock input, a normal data input, a test data input, a normal data output and a scan data output. The flip-flop has a normal operating mode during which the normal data output is enabled and the scan data output disabled and has a scan-shift mode during which the normal data output is disabled and the scan data output is enabled.

Another aspect of the disclosure relates to a scannable flip-flop, which includes a normal data input, a test data input, a normal data output, a scan data output, and a test enable input. The test enable input has an inactive state in which the normal data input is selectively coupled to the normal data output and the scan data output is disabled and has an active state in which the test data input is selectively coupled to the scan data output and the normal data output is disabled.

A further aspect of the disclosure relates to a method, which includes: applying a normal data input signal, a test data input signal, and a test enable input signal to a flip-flop; latching the normal data input signal to a normal data output of the flip-flop in response to a clock signal and disabling a scan data output of the flip-flop, when the test enable input has an inactive state; and latching the test data input signal to the scan data output in response to the clock signal and disabling the normal data output, when the test enable input has an active state.

DETAILED DESCRIPTION OF ILLUSTRATIVE EMBODIMENTS

Figure 1:
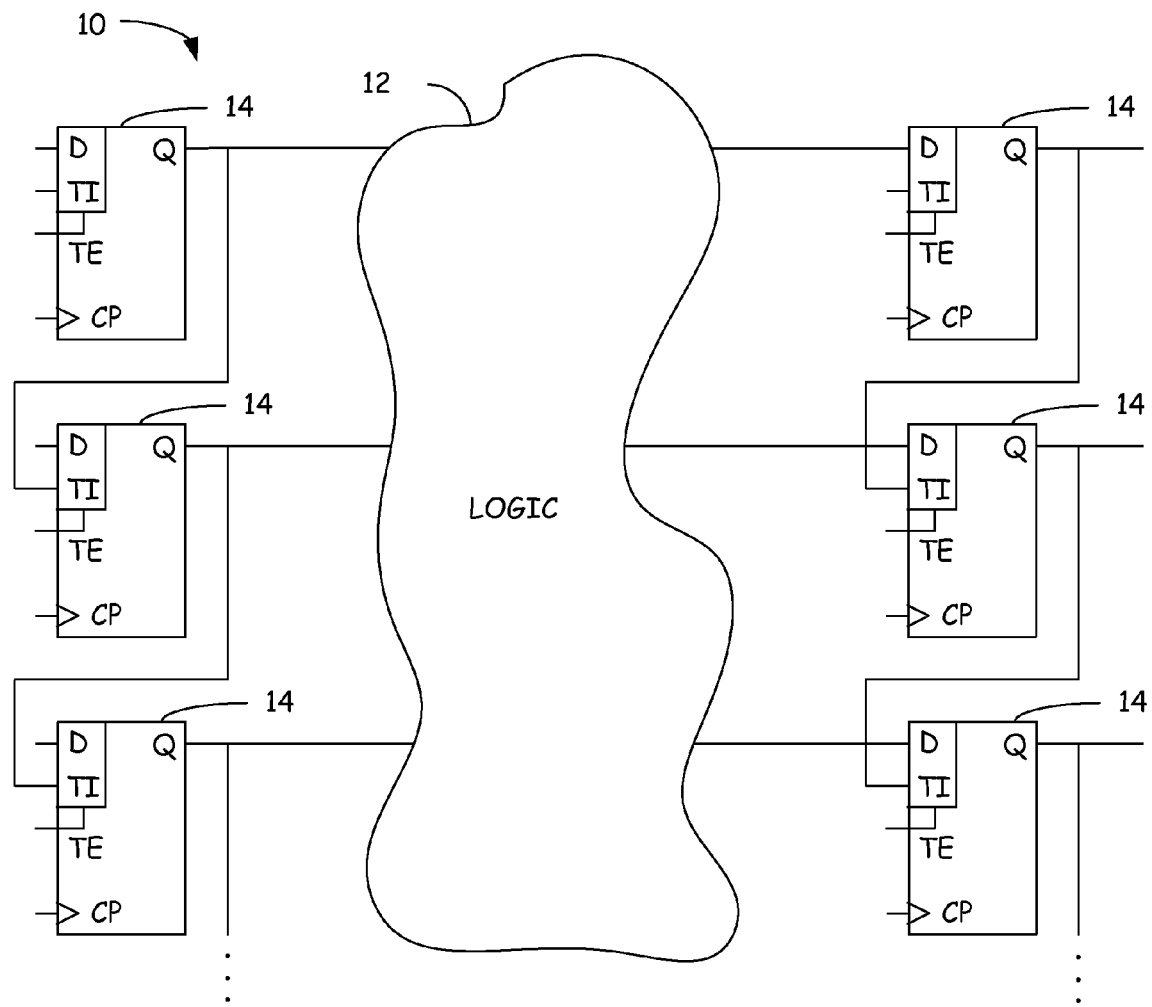
FIG. 1 is a block diagram illustrating a logic design that can be implemented on an integrated circuit, for example.

FIG. 1 is a block diagram illustrating a logic design 10 that can be implemented on an integrated circuit, for example. Design 10 includes functional logic 12 and a plurality of sequential elements 14, which are implemented as scannable D-type flip-flops. Each sequential element 14 has a normal data input "D", a test data input "TI", a test enable input "TE", a clock input "CP", and a data output "Q". Each sequential element 14 applies data from the normal data input D or the test data input TI to the output Q on the rising (and/or falling edge) of a clock signal applied to clock input CP based on the logic state of a test enable signal applied to test enable input TE. The sequential elements 14 are connected together to form a scan chain by connecting the output Q of each element to the test data input TI of the next, subsequent scannable element in the chain.

When the test enable input TE is inactive, the scannable elements 14 are in a normal data flow mode in which the data applied to data input D is applied to data output Q at the appropriate edge of the clock signals applied to clock input CP. When the test enable input TE is activated, the scannable elements 14 switch from a normal data flow mode to a scan mode. In the scan mode, each scannable element 14 is controlled to apply data from the test data input TI to the data output Q at the appropriate edge of the clock signals applied to clock input CP.

A test vector can be loaded into the scannable elements by serially shifting the test vector through the scan chain. After the test vector is loaded, the test enable inputs TE are deactivated and the scannable elements switch from the scan mode to the normal data flow mode. After a selected number of clock cycles, the test enable inputs are again activated. The resulting data that is stored in the scannable elements 14 forms an output vector, which can be shifted out through the scan chain and compared with an expected output vector.

Figure 2:
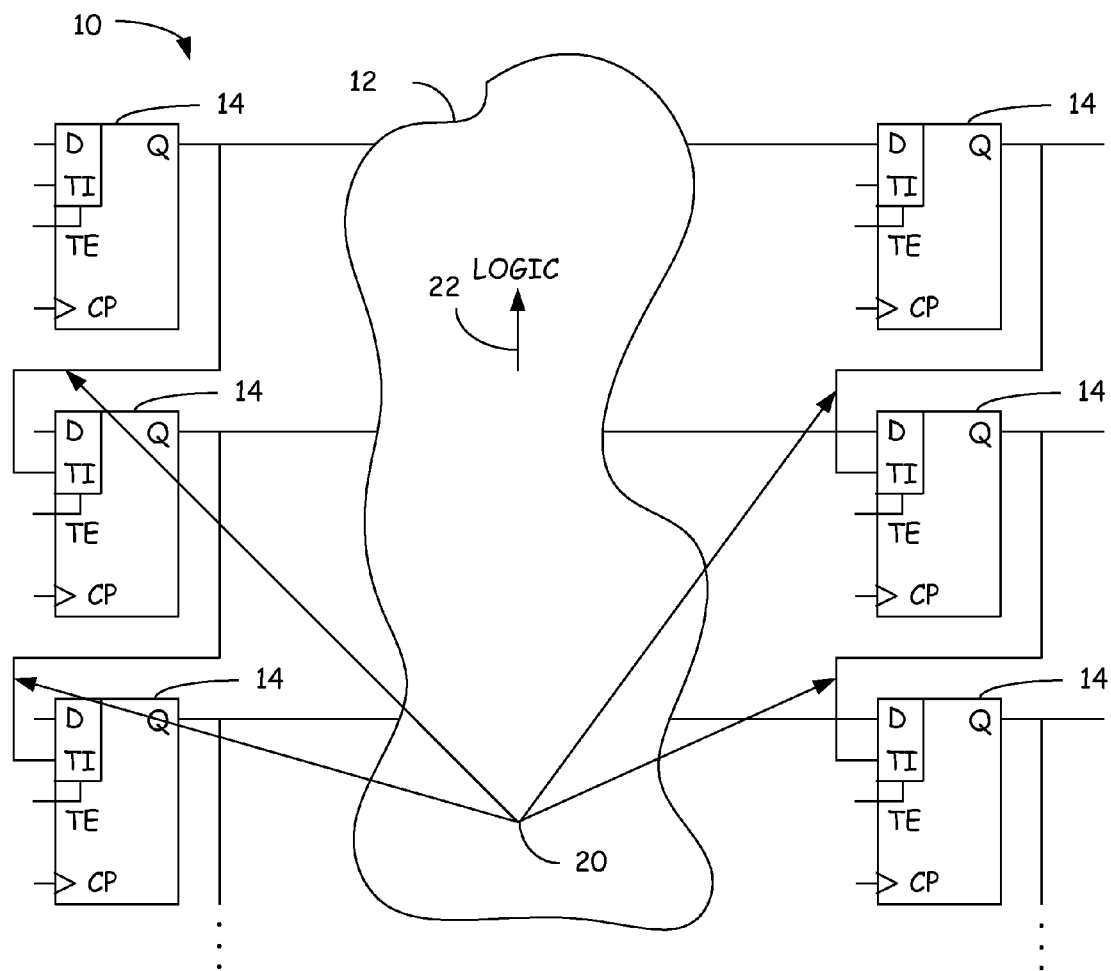
FIG. 2 illustrates unnecessary power consumption within the logic design during a normal, functional operating mode and unnecessary power consumption during a scan-shift mode.

One of the difficulties encountered when using scannable 1S elements such as those shown in FIG. 1 is that the test logic formed by the scan chain toggles during normal operation and therefore consumes power even though the test logic is not used as part of the normal function of the design. FIG. 2 illustrates unnecessary power consumption within design 10 during the normal, functional operating mode. In the normal functional operating mode, each data output Q toggles with changes in the logic state on the respective normal data inputs D. Since the data outputs Q are coupled to corresponding test data inputs TI of the next scannable element 14 in the scan chain, the test logic within the next scannable element 14 also toggles during normal switching of the data outputs. Arrows 20 illustrate unnecessary scan-chain toggling that consumes power during normal operation.

FIG. 2 also illustrates unnecessary power consumption during the scan-shift mode of design 10. During scan-shift, the test enable input TE of each scannable element 14 is active so that the output vectors can be serially shifted from the data output Q to the test data input TI of the next scannable element 14 in the scan chain. Therefore, as the vectors are serially shifted through the scan chain, data outputs Q change state, resulting in unnecessary toggling of the functional logic 12, illustrated by arrow 22. It has been found that the maximum power consumption of a particular integrated circuit device can occur during scan shift.

Figure 3:
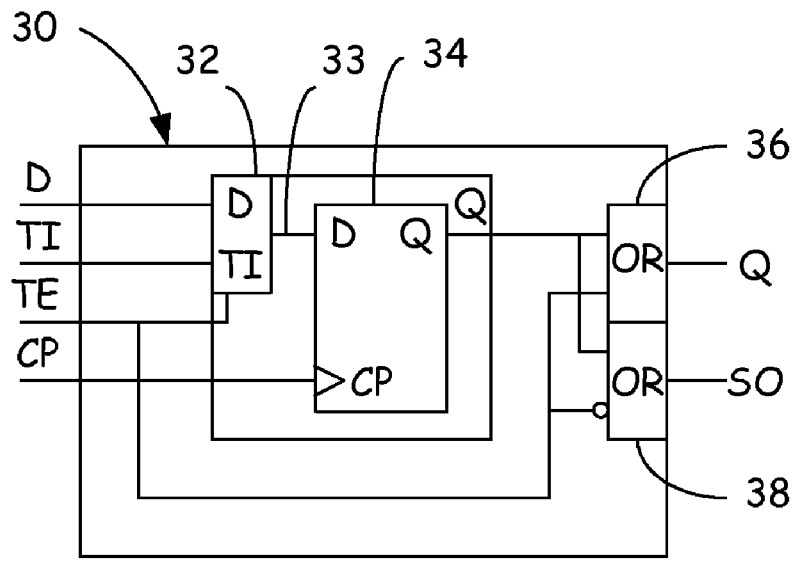
FIG. 3 is a simplified block diagram illustrating a scannable, sequential element according to an exemplary embodiment of the present disclosure.

The extra power consumption during normal mode and/or during scan mode can be reduced by replacing one or more of the scannable elements 14 with a power-reducing scannable element such as that shown in FIG. 3.

FIG. 3 is a simplified block diagram illustrating a scannable element 30 according to an exemplary embodiment of the present disclosure. In this embodiment, scannable element 30 is implemented as a scannable D-type flip-flop. However, scannable element 30 can be implemented as any other type of flip-flop or other sequential latch element in alternative embodiments, which can be edge or level triggered, for example.

In the embodiment shown in FIG. 3, scannable element 30 includes a normal data input D, a test data input TI, a test enable input TE, a clock input CP, a gated normal data output Q and scan output SO. The normal data input D and the test data input TI are applied to the inputs of a logic block, which in this embodiment includes a multiplexer 32. Multiplexer 32 selects one of the two inputs as a function of the logic state applied to test enable input TE. The selected input is applied to a multiplexer output 33, which is coupled to the data input D of latch 34. In this embodiment, latch 34 includes a D-type flip-flop. At the next rising clock edge (and/or falling edge) of clock input CP, the selected input is applied to latch output Q of flip-flop 34.

Latch output Q is gated by a gating circuit, which includes logic gates 36 and 38 that separately gate the normal data output Q and the scan data output SO. In this example, logic gates 36 and 38 implement logic-OR functions. However, other types of gates can be used in alternative embodiments, which can implement similar or different logic functions and/or additional logic functions, if desired. Logic gate 36 is coupled between the latch output Q of flip-flop 34 and the normal data output Q of scannable element 30 and gates the latch output Q with the test enable input TE. Logic gate 38 is coupled between the latch output Q and scan output SO and gates the scan output with a complement of the test enable input TE.

Thus, when test enable input TE is inactive, normal data output Q is enabled and scan output SO is disabled. When test enable input TE is active, normal data output Q is disabled and scan output SO is enabled.

Figure 4:
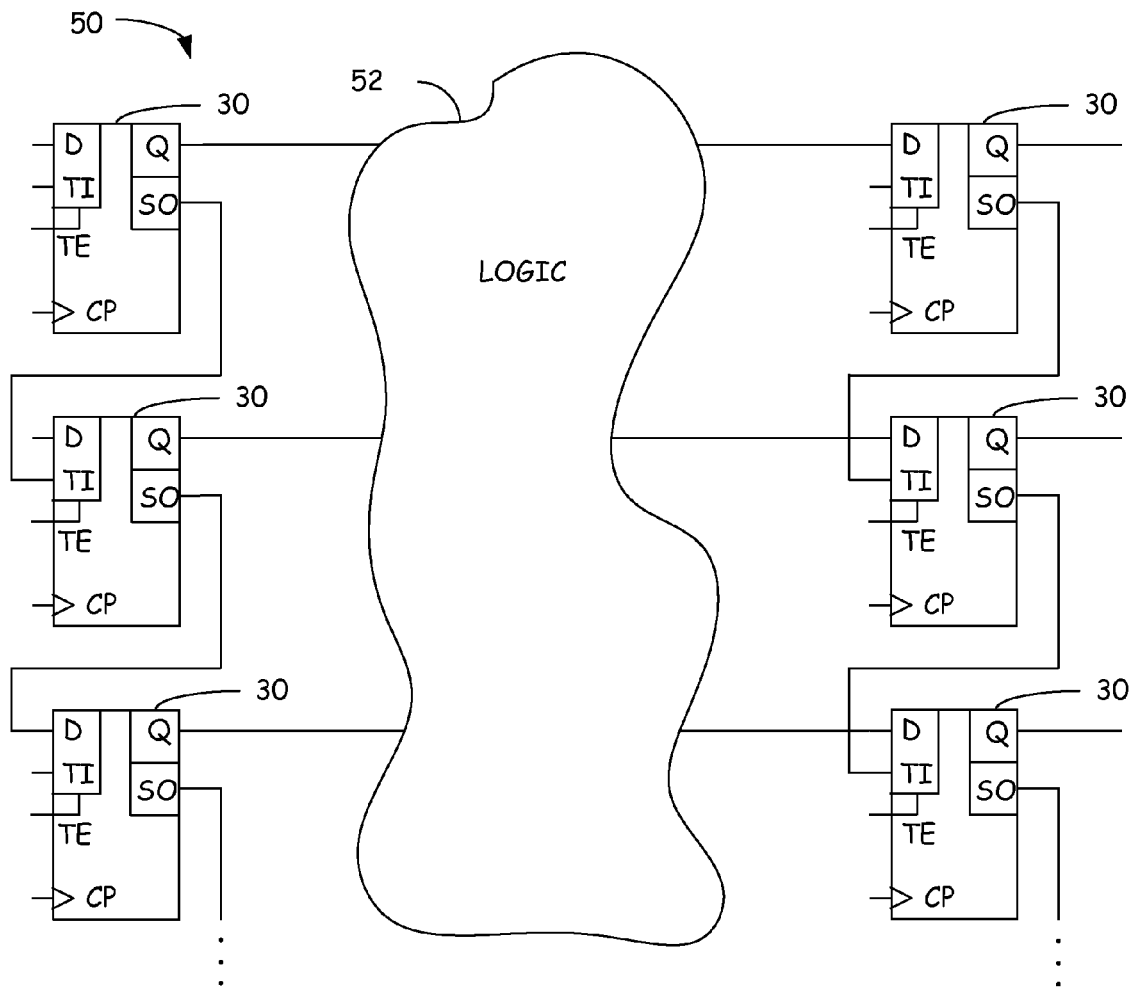
FIG. 4 is a block diagram illustrating a logic design, which includes a scan chain formed by a plurality of the sequential elements shown in FIG. 3.

FIG. 4 is a block diagram illustrating a logic design 50, which can be implemented on an integrated circuit, for example, and includes functional logic 52 and a plurality of sequential elements 30, as shown in FIG. 3. Sequential elements 30 are coupled to functional logic 52 for normal operation and are also connected together to form a scan chain by connecting the scan output SO of each element to the test data input TI of the next, subsequent scannable element in the chain. The normal data outputs Q of sequential elements 30 are not connected to the scan chain.

Table 1 provides a truth table illustrating the logic function of scannable element 30, according to the embodiment shown in FIG. 3.

TABLE 1

| TE | Q | SO |
|---|---|---|
| 0 | D | 1 |
| 1 | 1 | TI |

In the normal functional operating mode, the test enable input TE of each scannable elements 30 is inactive (e.g., a logic "0"). Since TE=0, logic-OR gate 36 passes the selected, normal data input D to normal data output Q. Therefore, normal data output Q follows the normal data input D. However, logic-OR gate 38 holds scan output SO high (SO=1) due to the complement of TE being a logic high. As a result, SO does not toggle during the normal, functional operating mode, which ensures that the test logic within the next scannable element 30 in the scan chain also does not toggle. Thus, the test logic coupled to the TI inputs does not consume power due to unnecessary toggling.

During the scan-shift mode, the test enable input TE of each scannable element 30 is active (e.g., a logic "1"). Multiplexer 32 applies the test data input TI to flip-flop 34, which passes the test data input to logic-OR gates 36 and 38. Since TE=1 (and thus the complement of TE is "0"), logic-OR gate 38 passes the test data input to scan output SO so that vectors can be serially shifted through the scan chain, from each SO to the next TI in the chain.

However, logic-OR gate 36 holds the normal data output Q at a logic "1" which prevents the normal data output Q from toggling with changes in the data applied to test data input TI during scan-shift. Since the normal data outputs of scannable elements 30 do not toggle, these data outputs do not cause unnecessary toggling of functional logic 52 (shown in FIG. 4) during the scan-shift mode. In some embodiments, disabling the normal data outputs can conserve significant power consumption during scan-shift mode.

Figure 5:
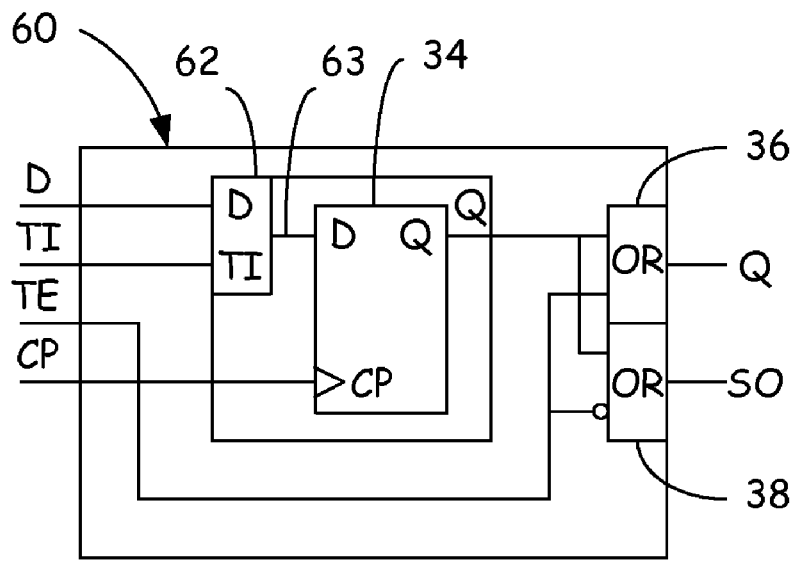
FIG. 5 is a simplified block diagram illustrating a scannable, sequential element according to an alternative embodiment of the present disclosure.

FIG. 5 is a simplified block diagram illustrating a scannable element 60 according to an alternative embodiment of the present disclosure. The same reference numerals are used in FIG. 5 as are used in FIG. 3 for the same or similar elements. In this embodiment, multiplexer 32 is replaced with an exclusive-NOR gate 62, known generally as an "equivalence" gate. Its output 63 is true (e.g., a logic "1") if both inputs are equal to one another and false (e.g., a logic "0") if the inputs are different from one another. The test enable input TE is used to gate the outputs Q and SO, but is not used to multiplex the inputs D and TI.

This embodiment is based on observations of the embodiment shown in FIG. 3. A first observation is that during the normal, functional operating mode, all scannable elements 30 have a logic "1" at the SO output. Therefore all scannable elements have a logic "1" at the TI input. A second observation is that during scan-shift mode, all scannable elements 30 have a logic "1" at their normal data output Q. This means that during scan-shift all the normal data inputs D of the scannable elements that are connected to functional logic 52 have a defined value (either a logic "1" or a logic "0"), assuming the functional logic cone is driven by only defined inputs and scannable elements 30, for example. Using these observations, the use of TE to multiplex between D and TI is not necessary.

Table 2 is a truth table illustrating the logic function of scannable element 60 in which the input multiplexer is replaced with an XNOR gate, according to the embodiment shown in FIG. 5 within the context of design 50 (shown in FIG. 4).

TABLE 2

| TE | D | TI | Q | SO |
|----|---|----|---|----|
| 0  | D | 1  | D | 1  |
| 1  | 1 | TI | 1 | TI |
| 1  | 0 | TI | 1 | NOT TI |

During the normal, functional operating mode, TE=0 and the normal data input D can take on any value (a 1 or 0) determined by the functional logic to which it is connected. The test data input TI is held at a logic "1", as set by the scan output SO of the previous element 60 in the scan chain. Data output Q follows the data input D, and scan output SO is set to "1".

During the scan-shift operating mode, TE=1, as illustrated by the second and third rows in Table 2, and data input D can be either a "1" as shown in row two or a "0" as shown in row 3. The test data input has a value "TI" and can be either a "1" or a "0" depending on the scan output SO of the previous element in the chain. Normal data output Q is disabled and set to a "1". When normal data input D is a "1", it is equivalent to the test data input TI and therefore scan output SO is "true" and equal to TI. When normal data input D is a "0", it is not equivalent to the test data input TI and therefore scan output SO is "false" and equal to "not TI".

The inversion of TI on scan output SO can be accounted for when analyzing the vectors that are scanned through the scan chain. Therefore, TE is not needed to select between TI and D.

In a further embodiment, logic gates 36 and 38 are replaced with pass gates. A first pass gate selectively passes the latch output to the normal data output when the test enable input is inactive (e.g., when TE=0). A second pass gate selectively passes the latch output to the scan data output when the test enable input is active (e.g., when TE=1). Other types of gating circuits can be used in further embodiments such as those shown in FIGS. 6 and 7.

Figure 6:
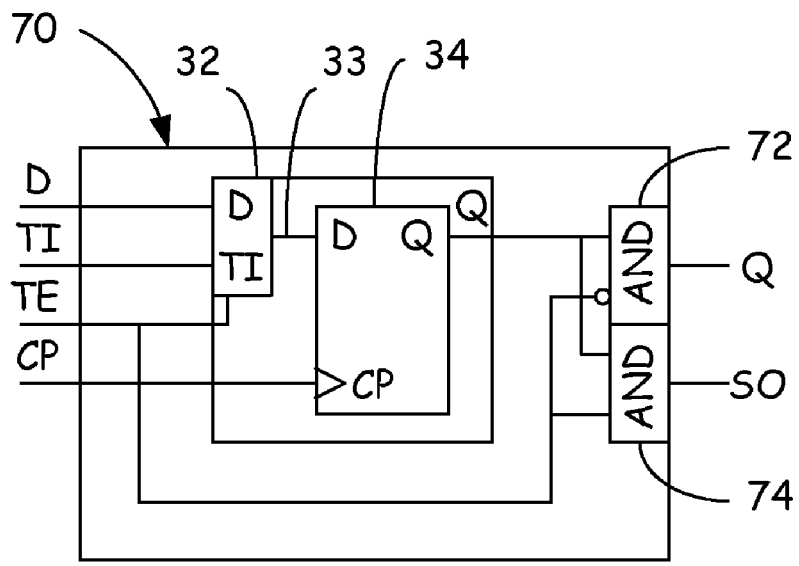
FIG. 6 is a simplified block diagram illustrating a scannable, sequential element according to a further embodiment of the present disclosure.

FIG. 6 is a simplified block diagram illustrating a scannable, sequential element 70 according to a further embodiment of the present disclosure. The same reference numerals are used in FIG. 6 as were used in FIG. 3 for the same or similar elements. In this example, latch output Q is gated by a gating circuit, which includes a logic-AND gate 72 and a logic-AND gate 74, which separately gate the normal data output Q and the scan data output SO. Logic-AND gate 72 is coupled between the latch output Q of flip-flop 34 and the normal data output Q of scannable element 70 and gates the latch output Q with the complement of test enable input TE. Logic-AND gate 74 is coupled between the latch output Q and scan output SO and gates the scan output with test enable input TE.

Thus, when test enable input TE is inactive, normal data output Q is enabled and scan output SO is disabled (e.g., held to a logic "0"). When test enable input TE is active, normal data output Q is disabled (e.g., held to a logic "0") and scan output SO is enabled.

Table 3 provides a truth table illustrating the logic function of scannable element 70, according to the embodiment shown in FIG. 6.

TABLE 3

| TE | Q | SO |
|----|---|----|
| 0  | D | 0  |
| 1  | 0 | TI |

Figure 7:
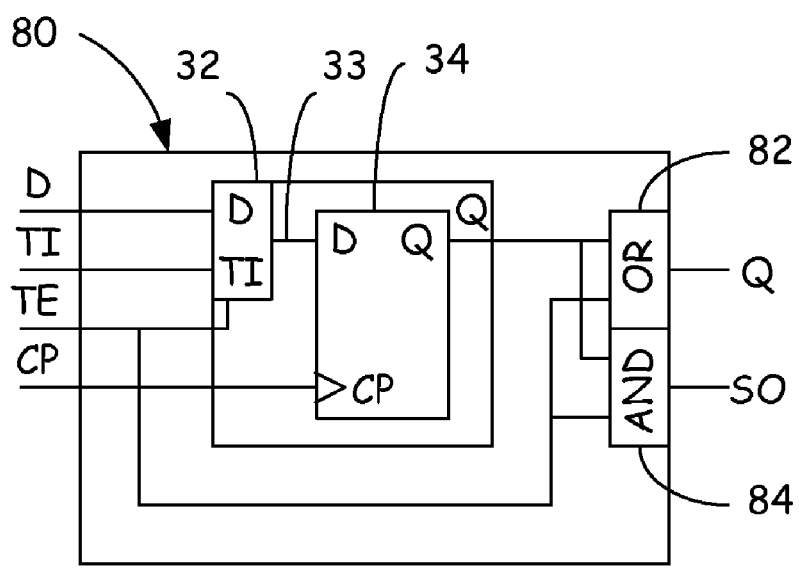
FIG. 7 is a simplified block diagram illustrating a scannable, sequential element according to a further embodiment of the present disclosure.

FIG. 7 is a simplified block diagram illustrating a scannable, sequential element 80 according to a further embodiment of the present disclosure. The same reference numerals are used in FIG. 7 as were used in FIG. 3 for the same or similar elements. In this example, latch output Q is gated by a gating circuit, which includes a logic-OR gate 82 and a logic-AND gate 84, which separately gate the normal data output Q and the scan data output SO. Logic-OR gate 82 is coupled between the latch output Q of flip-flop 34 and the normal data output Q of scannable element 80 and gates the latch output Q with test enable input TE. Logic-AND gate 84 is coupled between the latch output Q and scan output SO and gates the scan output with test enable input TE.

Thus, when test enable input TE is inactive, normal data output Q is enabled and scan output SO is disabled (e.g., held to a logic "0"). When test enable input TE is active, normal data output Q is disabled (e.g., held to a logic "1") and scan output SO is enabled.

Table 4 provides a truth table illustrating the logic function of scannable element 80, according to the embodiment shown in FIG. 7.

TABLE 4

| TE | Q | SO |
|----|---|----|
| 0  | D | 0  |
| 1  | 1 | TI |

Although the present disclosure has been described with reference to one or more embodiments, workers skilled in the art will recognize that changes may be made in form and detail without departing from the scope of the disclosure or the appended claims. For example, the scannable element can be modified to implement different and/or additional functionality and may include additional input and/or outputs. The gating of Q and SO can be accomplished by a variety of different logic circuits. Also, any particular scan chain can be modified to include one or more scannable elements such as those described herein, and not all of the elements in the chain need to be of the same type. Also, the term "coupled" as used in the specification and the claims can include a direct connection and/or a connection through one or more intermediate elements.

What is claimed is:

1. A scannable flip-flop comprising:
   a clock input;
   a normal data input and a test data input;
   a normal data output and a scan data output;

a normal operating mode during which the normal data output is enabled and the scan data output outputs a first logic value that remains constant when the clock input changes;
a scan-shift mode during which the normal data output outputs a second logic value that remains constant when the clock input changes and the scan data output is enabled, and
wherein the first and second logic values are selected to be one of equivalent or not equivalent.

2. The scannable flip-flop of claim 1 and further comprising:
a test enable input;
a logic block, which receives the normal data input and the test data input and has a logic block output;
a latch, which latches the logic block output in response to the clock input and has a latch output; and
a gating circuit, which gates the latch output to the normal data output and to the scan data output separately as a function of the test enable input.

3. The scannable flip-flop of claim 2 wherein the logic block comprises:
a multiplexer, which selectively applies the normal data input or the test data input to the latch as a function of the test enable input.

4. The scannable flip-flop of claim 2 wherein the latch comprises a D-type flip-flop.

5. The scannable flip-flop of claim 2 wherein the gating circuit comprises:
a first circuit, which passes the latch output to the normal data output when the test enable input has an inactive state and blocks the latch output from reaching the normal data output when the test enable input has an active state; and
a second circuit, which passes the latch output to the scan data output when the test enable input has the active state and blocks the latch output from reaching the scan data output when the test enable input has the inactive state.

6. The scannable flip-flop of claim 2 wherein the first and second logic values are selected to be equivalent and wherein the gating circuit comprises:
a first logic-AND gate, which gates the latch output with a complement of the test enable input and has an output coupled to the normal data output; and
a second logic-AND gate, which gates the latch output with the test enable input and has an output coupled to the scan data output.

7. The scannable flip-flop of claim 2 wherein the first and second logic values are selected to be equivalent and wherein the gating circuit comprises:
a logic-OR gate, which gates the latch output with the test enable input and has an output coupled to the normal data output; and
a logic-AND gate, which gates the latch output with the test enable input and has an output coupled to the scan data output.

8. A scannable flip-flop comprising:
a clock input;
a normal data input and a test data input;
a normal data output and a scan data output;
a normal operating mode during which the normal data output is enabled and the scan data output disabled;
a scan-shift mode during which the normal data output is disabled and the scan data output is enabled;
a test enable input;
a logic block, which receives the normal data input and the test data input and has a logic block output;
a latch, which latches the logic block output in response to the clock input and has a latch output; and
a gating circuit, which gates the latch output to the normal data output and to the scan data output separately as a function of the test enable input and wherein the logic block comprises:
an exclusive-NOR gate having a first input coupled to the normal data input, a second input coupled to the test data input and an output coupled to the latch.

9. A scannable flip-flop comprising:
a clock input;
a normal data input and a test data input;
a normal data output and a scan data output;
a normal operating mode during which the normal data output is enabled and the scan data output disabled;
a scan-shift mode during which the normal data output is disabled and the scan data output is enabled;
a test enable input;
a logic block, which receives the normal data input and the test data input and has a logic block output;
a latch, which latches the logic block output in response to the clock input and has a latch output; and
a gating circuit, which gates the latch output to the normal data output and to the scan data output separately as a function of the test enable input and wherein the gating circuit comprises:
a first logic-OR gate, which gates the latch output with the test enable input and has an output coupled to the normal data output; and
a second logic-OR gate, which gates the latch output with a complement of the test enable input and has an output coupled to the scan data output.

10. A scannable flip-flop comprising:
a normal data input and a test data input;
a normal data output and a scan data output; and
a test enable input, which has an inactive state in which the normal data input is selectively coupled to the normal data output and the scan data output outputs a first logic value that remains constant, and which has an active state in which the test data input is selectively coupled to the scan data output and the normal data output outputs a second logic value that remains constant, and
wherein the first and second logic values are selected to be one of equivalent or not equivalent.

11. The scannable flip-flop of claim 10 and further comprising:
a logic block, which receives the normal data input and the test data input and has a logic block output;
a latch, which latches the logic block output and has a latch output; and
a gating circuit, which gates the latch output to the normal data output and to the scan data output separately as a function of the test enable input.

12. The scannable flip-flop of claim 11 wherein the logic block comprises:
a multiplexer, which selectively applies the normal data input or the test data input to the latch as a function of the test enable input.

13. The scannable flip-flop of claim 11 and further comprising a clock input and wherein the latch comprises a D-type flip-flop, which latches data to the latch output in response to the clock input.

14. The scannable flip-flop of claim 11 wherein the gating circuit comprises:
a first circuit, which passes the latch output to the normal data output when the test enable input has the inactive state and blocks the latch output from reaching the normal data output when the test enable input has the active state; and a second circuit, which passes the latch output to the scan data output when the test enable input has the active state and blocks the latch output from reaching the scan data output when the test enable input has the inactive state.

15. A scannable flip-flop comprising:

a normal data input and a test data input;

a normal data output and a scan data output;

a test enable input, which has an inactive state in which the normal data input is selectively coupled to the normal data output and the scan data output is disabled to a first logic value, and which has an active state in which the test data input is selectively coupled to the scan data output and the normal data output is disabled;

a logic block, which receives the normal data input and the test data input and has a logic block output;

a latch, which latches the logic block output and has a latch output; and a gating circuit, which gates the latch output to the normal data output and to the scan data output separately as a function of the test enable input and wherein the logic block comprises:

an exclusive-NOR gate having a first input coupled to the normal data input, a second input coupled to the test data input and an output coupled to the latch.

16. A scannable flip-flop comprising:

a normal data input and a test data input;

a normal data output and a scan data output;

a test enable input, which has an inactive state in which the normal data input is selectively coupled to the normal data output and the scan data output is disabled to a first logic value, and which has an active state in which the test data input is selectively coupled to the scan data output and the normal data output is disabled;

a logic block, which receives the normal data input and the test data input and has a logic block output;

a latch, which latches the logic block output and has a latch output; and a gating circuit, which gates the latch output to the normal data output and to the scan data output separately as a function of the test enable input and wherein the gating circuit comprises:

a first logic gate, which gates the latch output with at least one of the test enable input or a complement of the test enable input, and has an output coupled to the normal data output; and a second logic gate, which gates the latch output with at least one of the test enable input or a complement of the test enable input, and has an output coupled to the scan data output.

17. A method comprising:

applying a normal data input, a test data input, and a test enable input to a flip-flop;

latching the normal data input to a normal data output of the flip-flop in response to a clock signal and outputting a constant first logic value at a scan data output of the flip-flop when the test enable input has an inactive state; and latching the test data input to the scan data output in response to the clock signal and outputting a constant second logic value at the normal data output when the test enable input has an active state and wherein the first and second logic values are selected to be one of equivalent or not equivalent.

18. The method of claim 17 and further comprising:

multiplexing the normal data input with the test data input as a function of the test enable input.

19. A method comprising:

applying a normal data input, a test data input, and a test enable input to a flip-flop;

latching the normal data input to a normal data output of the flip-flop in response to a clock signal and disabling a scan data output of the flip-flop when the test enable input has an inactive state; and latching the test data input to the scan data output in response to the clock signal and disabling the normal data output when the test enable input has an active state; and applying the normal data input and the test data input to the inputs of a logic equivalence circuit, wherein the steps of latching comprise latching an output of the equivalence circuit.

* * * * *